United States Patent [19]

Moddel et al.

[11] Patent Number: 4,539,431
[45] Date of Patent: Sep. 3, 1985

[54] PULSE ANNEAL METHOD FOR SOLAR CELL

[75] Inventors: Garret R. Moddel; James F. Gibbons, both of Palo Alto, Calif.

[73] Assignee: Sera Solar Corporation, Santa Clara, Calif.

[21] Appl. No.: 501,601

[22] Filed: Jun. 6, 1983

[51] Int. Cl.³ .................... H01L 31/06; H01L 31/18
[52] U.S. Cl. ............................ 136/258; 29/572; 29/576 T; 148/1.5; 357/30; 427/39; 427/74
[58] Field of Search ............... 136/258 PC, 258 AM, 136/261, 290; 357/2, 30; 148/1.5; 29/572, 576 T; 429/111; 427/74, 39

[56] References Cited

U.S. PATENT DOCUMENTS

| | | | |
|---|---|---|---|
| 4,273,950 | 6/1981 | Chitre | 136/255 |
| 4,331,485 | 5/1982 | Gat | 148/1.5 |
| 4,353,160 | 10/1982 | Armini et al. | 29/572 |
| 4,370,175 | 1/1983 | Levatter | 148/1.5 |
| 4,370,510 | 1/1983 | Stirn | 136/262 |
| 4,379,020 | 4/1983 | Glaeser et al. | 156/603 |
| 4,385,198 | 5/1983 | Rahilly | 136/249 |
| 4,392,011 | 7/1983 | Pankove et al. | 136/261 |
| 4,392,297 | 7/1983 | Little | 29/572 |

OTHER PUBLICATIONS

G. A. Landis et al., *Conf. Record, 15th IEEE Photovoltaic Specialists Conf.*, (1981), pp. 976-980.
E. Fogarassy et al., *2nd E. C. Photovoltaic Solar Energy Conf.*, (1979), Reidel Pub. Co., (1979), pp. 768-775.
R. T. Young et al., *SPIE*, vol. 198, pp. 36-41, (1979).
Y. K. Chan et al., *Appl. Phys. Lett.*, vol. 22, pp. 628-629, (1973).
M. S. Wrighton et al., *J. Am. Chem. Soc.*, vol. 100, pp. 1602-1603, (1978).

*Primary Examiner*—Aaron Weisstuch
*Attorney, Agent, or Firm*—Flehr, Hohbach, Test, Albritton & Herbert

[57] ABSTRACT

A solar cell including a pulse annealed layer of crystalline, amorphous or polycrystalline semiconductor material of one conductivity type and either a layer of opposite conductivity type or a liquid electrolyte forming a collector junction therewith. A method of improving the characteristics of a solar cell including at least one layer of crystalline, amorphous or polycrystalline semiconductor material which includes the step of pulse annealing said semiconductor material.

3 Claims, 7 Drawing Figures

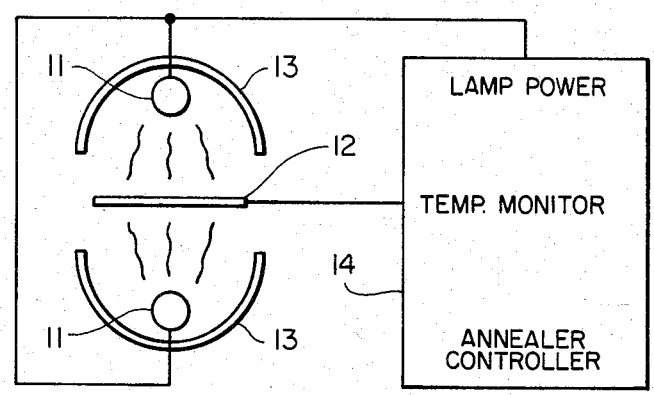
FIG_1
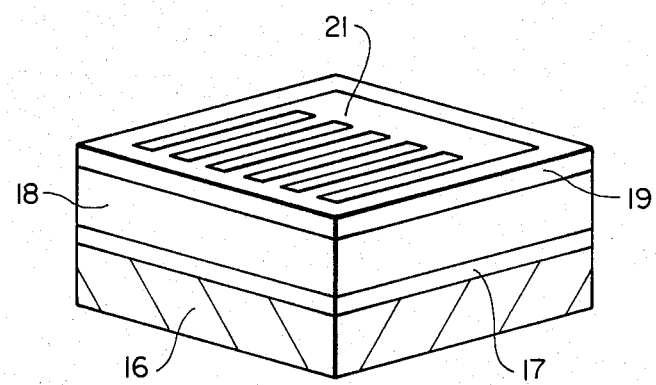
FIG_2
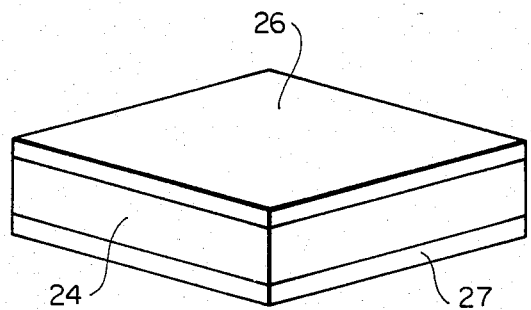
FIG_3

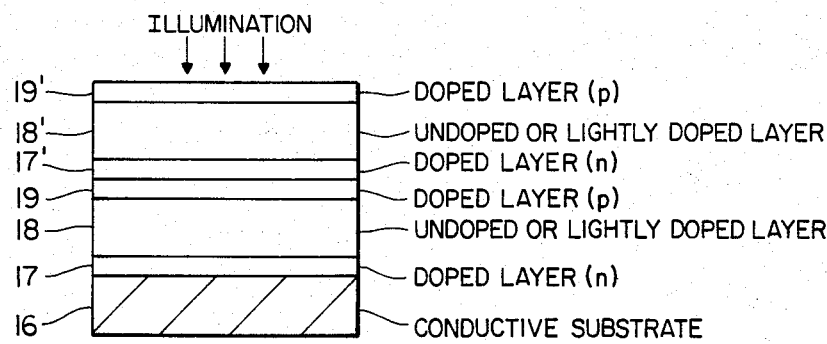
FIG_4
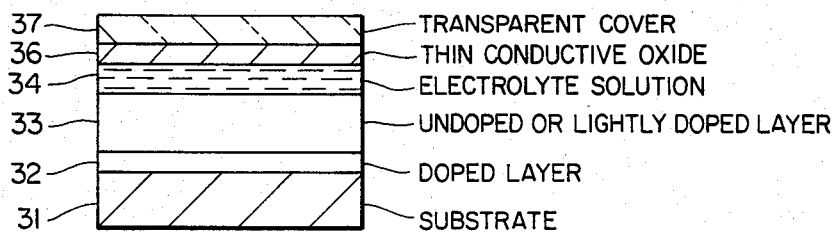
FIG_5
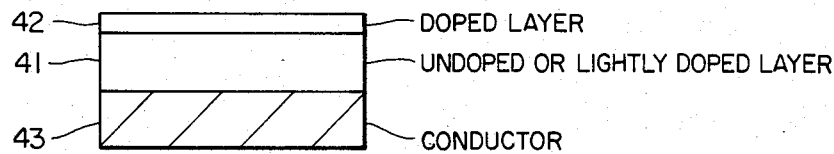
FIG_6
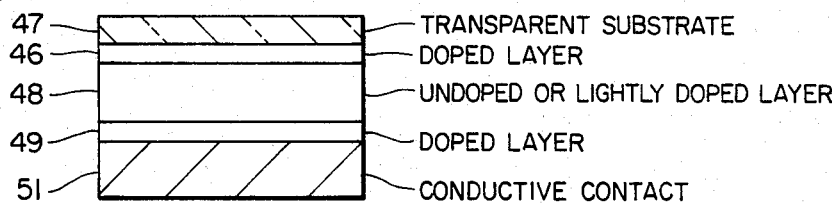
FIG_7

PULSE ANNEAL METHOD FOR SOLAR CELL

This invention relates generally to solar cells made of semiconductor material and more particularly to an annealing process for such solar cells.

In the production of semiconductor solar cells it is often advantageous or essential to include an annealing step. This annealing step typically involves the insertion of the semiconductor material into a furnace, maintained at an elevated temperature, for a period of time. It is believed that this serves to activate impurities and dopants in the semiconductor to modify their electronic properties; to cause the dopants to diffuse or migrate in the material in a controlled manner; to produce grain growth or coalescence of the semiconductor material; or to heal defects in the semiconductor lattice.

However, certain undesirable effects may accompany the intended consequences of the annealing. As the dopants are activated, they may redistribute such that they subsequently degrade the solar cell performance. Impurities or contaminants may diffuse into the active region of the solar cell and impair its performance.

In addition to producing deleterious effects, long annealing times may render impossible the fabrication of certain classes of solar cell structures, such as annealed multilayer thin film devices. Such devices are so thin (on the order of microns), that just the time required for them to reach thermal equilibrium in a furnace anneal can result in sufficient dopant redistribution to destroy the junctions (rectifying properties).

It is the object of the present invention to provide an improved method for annealing a solar cell.

It is another object of the invention to provide a pulse annealing method for the fabrication of solar cells.

These and other objects are achieved by a solar cell which includes one or more layers of crystalline, polycrystalline or amorphous semiconductor material and a method of making the solar cell.

FIG. 1 is a schematic view of pulse annealing apparatus suitable for practicing the present invention;

FIG. 2 is a perspective view of a solar cell comprised of three semiconductor layers processed in accordance with the present invention;

FIG. 3 is a perspective view of a three layer solar cell in which the center layer is crystalline and processed in accordance with the present invention;

FIG. 4 is a section view of a tandem solar cell comprised of six semiconductor layers processed in accordance with the present invention;

FIG. 5 is a sectional view of a liquid junction solar cell with the semiconductor material processed in accordance with the present invention;

FIG. 6 is a sectional view of a solar cell in which a conductor forms one of the junctions; and FIG. 7 is a sectional view of a solar cell in which only one semiconductor layer is annealed in accordance with the present invention.

A suitable pulse annealer is shown in FIG. 1 and consists of radiant heating sources 11 (high intensity lamps) which are pulsed (turned on) to temperatures which are substantially hotter than that which the semiconductor material 12 is to be annealed atains. Reflectors 13 reflect and concentrate the radiant heat energy onto the semiconductor 12. For example, the lamp filaments may be resistively heated to 3000° C. to bring the semiconductor material 12 up to a temperature of to 1000° C. The high temperature of the heating sources causes the semiconductor material 12 to reach its desired temperature rapidly, so that the entire anneal is completed in a time on the order of a few seconds.

The annealer controller 14 may be set up such that the power supplied to the lamps is a function of the measured temperature of the semiconductor 12, or alternately, a calibrated dummy may be used as the temperature control. This can be achieved by a feedback circuit which controls the intensity, or simply by a timed heat pulse of constant intensity. The radiation may fall on both sides of the semicondutor, as shown, or it may be applied to one side of a semiconductor wafer supported on a carrier.

FIG. 2 illustrates a solar cell of basic configuration. The cell consists of a conductive substrate 16 and sequentially deposited layers of amorphous or polycrystalline semiconductor material forming a collector junction for collecting carriers formed in the device by the impinging solar energy. The first layer 17 may be doped n-type (or p-type), the second layer 18 is intrinsic or lightly doped and the third layer 19 may be doped p-type (or n-type). The successive layers may be formed as described in U.S. Pat. No. 4,270,018. The structure is then inserted into the pulse annealer and heater for a short period of time. For example the annealer may be operated with the structure inserted so that the temperature of the semiconductor layers reaches about 800° C. for 15 seconds. A conductive comb-like contact structure 21 is formed on the upper layer 19 after the anneal.

As described in said patent the semiconductor material of the three layers may be amorphous or polycrystalline. The pulse anneal (i) causes grain growth and coalescence which improve the electronic transport properties of the material, (ii) activates the dopants in the outer layer which increases their conductivity, and (iii) depending on the semiconductor material, increase the optical transmittance of the doped layers. This permits a larger proportion (than before the anneal) of the illumination which is incident upon the cell to penetrate into the active inner layer 18 of the cell.

The pulse anneal accomplishes these purposes without the deleterious effects of a slow anneal described earlier. Additionally, the pulse anneal allows use of the metal or metal-coated substrate. In the normal anneal process the metal would alloy with the semiconductor during a slow anneal, consuming an excessive quantity of the semiconductor and/or metal film.

As an example, the structure may be realized on a nickel-coated ceramic substrate as follows: a layer of n-type amorphous silicon is deposited from the plasma decomposition of $SiH_4$ with 0.3% $PH_3$ added as a dopant; this step is followed immediately by the deposition of an intrinsic layer from pure $SiH_4$, which is then followed immediately with the deposition of a p-type layer from $SiH_4$ with 0.3% $B_2H_6$. The structure is then pulse annealed by raising the temperature of the device to 800° C. for 15 seconds.

In one example, pulse annealing of a 0.35 micron thick p-type layer of amorphous silicon at 800° C. for fifteen seconds decreased the sheet resistance from well over $10^6$ ohms/sq to 120 ohms/sq. The optical transmittance was increased as was evidenced by a decreased in the absorption coefficient for light at a wavelength of 0.6 microns from $5 \times 10^4$ cm$^{-1}$ to $5 \times 10^3$ cm$^{-1}$.

FIG. 3 illustrates a cell which is similar to that of FIG. 2 except that the center layer 24 is crystalline. This layer can be sufficiently rigid to make the use of a supporting substrate unnecessary. The doped outer layers 26, 27 may be formed by several means: (i) by implanting dopants and then pulse annealing the structure, (ii) by the deposition of a dopant onto the semiconductor surfaces (pre-dep) which is then diffused by pulse annealing to form a very shallow doped region, or (iii) by the deposition of a doped semiconductor onto the surface which may then be pulse annealed to improve its electronic and optical properties. As opposed to diffusion or implant and slow anneal, all three of these methods produce doped layers 26, 27 which are very thin and desirable for solar cells.

Heavily doped layers are generally inferior to undoped or lightly doped semiconductors in their minority carrier transport properties. The electron-hole pairs created from photons which are absorbed in a heavily doped layer have a reduced probability of being collected before they recombine. It is therefore desirable to keep the doped layer as thin as possible on the illuminated surface of a solar cell, so as little light is absorbed in it as possible. This can be accomplished in a pulse anneal process.

Referring again to FIG. 3 and assuming a p-type solar cell, the lower doped layer 27 may be formed by the deposition and anneal of a thin film of aluminum. When heated to 600° C., aluminum alloys with the silicon and dopes it heavily p-type. However, when it is alloyed above 600° C. for long periods of time, the aluminum can diffuse rapidly throughout the silicon and degrade the carrier lifetime, and can also spike through the silicon, decreasing the device's reverse breakdown voltage. To avoid this, the layer 27 of FIG. 3 may be fabricated by the deposition of 500 Å of aluminum onto a p-type silicon wafer followed by a one minute pulse anneal at 800° C. The top layer 26 may be formed by other means.

Referring to FIG. 4, the structure of FIG. 2 is repeated one or more times to produce a tandem solar cell. The illumination which is not absorbed in the upper cell penetrates into the lower cell where it is absorbed. The cells are connected in series and are designed to have a thickness such that each cell produces the same current. The semiconductor in each cell may be of the same type or of different types. The layers are deposited sequentially and then pulse annealed. Alternatively, a pulse anneal may be used after the deposition of some of the layers and before the deposition of the remaining ones.

As an example, after the process described in reference to FIG. 2 is carried out, an amorphous silicon n-i-p structure is deposited. The resulting cell, as depicted in FIG. 4, consists of an amorphous silicon solar cell over a polycrystalline solar cell. The amorphous cell makes most efficient use of the short wavelength region of the solar spectrum and passes the longer wavelengths to the polycrystalline cell beneath. The output voltage of the cell is the sum of the voltages of the two cells.

Referring once again to FIG. 2, the inner layer may be treated such that it does not crystallize during the pulse anneal, and thus maintains the excellent light absorbing properties of an amorphous layer. As an example, amorphous silicon films containing carbom atoms and deposited by the plasma decomposition of $SiH_4$ with the addition of 10% $CH_4$ do not crystallize after an anneal at temperatures which crystallize the films from pure $SiH_4$.

A pulse anneal-processed liquid junction solar cell is shown in FIG. 5. The upper doped semiconductor layer of the solid junction cells described above has been replaced by an electrolyte solution which sets up the depletion layer and an electric field in the undoped layer to collect the carriers which are photoproduced.

The liquid junction solar cell includes a substrate 31 which supports a doped semiconductor layer 32. An undoped solar energy absorbing region 33 overlies the layer 32. An electrolyte solution 34 forms a junction with the undoped layer 33. A conductive film 36 on the bottom side of transparent cover 37 makes ohmic contact to the liquid electrolyte 34. The cell is fabricated by producing the undoped and doped layers 33, 32 by the processes described earlier and employing a pulse anneal step. The electrolyte solution is then introduced and the cover is then applied.

Referring to FIG. 6, undoped and doped layers 41, 42 are deposited onto a conducting substrate 43, which serves as the second pole of the solar cell. The structure is then pulse annealed in accordance with the invention. The conductor 43 may be a metal, in which case illumination will enter through the upper doped layer 42. Alternatively the conductor 43 may be a thin conducting oxide through which the light may enter into the active region of the cell.

A solar cell in which only one layer is pulse annealed is shown in FIG. 7. A doped semiconductor layer 46 is deposited onto a transparent substrate 47 and is then pulse annealed. The remaining layers are subsequently deposited. The layers comprise an undoped absorbing layer 48, doped layers 49 and conductive contact 51.

Although the formation of solar cells including amorphous or polycrystalline layers has been emphasized, it will be clear to one skilled in the art that the same process can be employed for crystalline semiconductor materials. For example, solar cells of high efficiency have been formed by implanting boron on one side of and phosphorous on the other side of a lightly doped n-type wafer and pulse annealing at 800° C. for 8 seconds.

Thus, it is seen that there has been provided a solar cell which includes one or more semiconductor layers which are pulse annealed. The pulse anneal aids in grain growth and dopant activation without redistribution of the dopant and impurity diffusion associated with slow anneals.

What is claimed:

1. The method of making a solar cell which comprises the steps of depositing on a substrate
   a first layer of n-type amorphous silicon, followed by a second layer of amorphous silicon containing carbon atoms, followed by a third layer p-type amorphous silicon, and
   annealing the entire structure by rapidly heating with radiant thermal energy for a short period of time, said carbon atoms minimizing crystallization of said second layer and maintaining high light absorption.

2. The method of claim 1 in which the first layer is formed by plasma decomposition of $SiH_4$ with 0.3% $PH_3$, the second layer by plasma decomposition of $SiH_4$ with 10% $CH_4$ and the third layer by plasma decomposition of $SiH_4$ and 0.3% $B_2H_6$.

3. A solar cell formed by the method of claim 2.

* * * * *